(12) United States Patent
Xue et al.

(10) Patent No.: US 8,624,380 B2
(45) Date of Patent: *Jan. 7, 2014

(54) VERTICAL MOUNT PACKAGE FOR MEMS SENSORS

(75) Inventors: Xiaojie Xue, Woburn, MA (US); Carl Raleigh, Phoenix, AZ (US); Thomas M. Goida, Windham, NH (US)

(73) Assignee: Analog Devices, Inc., Norwood, MA (US)

( * ) Notice: Subject to any disclaimer, the term of this patent is extended or adjusted under 35 U.S.C. 154(b) by 32 days.

This patent is subject to a terminal disclaimer.

(21) Appl. No.: 13/465,213

(22) Filed: May 7, 2012

(65) Prior Publication Data

US 2012/0235253 A1  Sep. 20, 2012

Related U.S. Application Data

(63) Continuation of application No. 12/570,950, filed on Sep. 30, 2009, now Pat. No. 8,174,111.

(60) Provisional application No. 61/101,437, filed on Sep. 30, 2008.

(51) Int. Cl.
*H01L 29/72* (2006.01)

(52) U.S. Cl.
USPC ........... 257/692; 257/254; 257/415; 257/666; 257/684; 257/787

(58) Field of Classification Search
USPC .......... 257/254, 415, 666, 684, 692, 773, 787
See application file for complete search history.

(56) References Cited

U.S. PATENT DOCUMENTS

| 5,616,863 A | 4/1997 | Koen |
| 5,889,658 A | 3/1999 | Sullivan et al. |

(Continued)

FOREIGN PATENT DOCUMENTS

| EP | 1813951 A1 | 8/2007 |
| WO | 2008011585 A2 | 1/2008 |

OTHER PUBLICATIONS

International Searching Authority, International Search Report—International Application No. PCT/US2009/059064, dated May 7, 2010, together with the Written Opinion of the International Searching Authority, 9 pages.

*Primary Examiner* — Edward Wojciechowicz
(74) *Attorney, Agent, or Firm* — Sunstein Kann Murphy & Timbers LLP

(57) ABSTRACT

A vertical mount pre-molded type package for use with a MEMS sensor may be formed with a low moisture permeable molding material that surrounds a portion of the leadframes and forms a cavity in which one or multiple dies may be held. The package includes structures to reduce package vibration, reduce die stress, increase vertical mount stability, and improve solder joint reliability. The vertical mount package includes a first leadframe having first leads and molding material substantially surrounding at least a portion of the first leads. The molding material forms a cavity for holding the MEMS sensor and forms a package mounting plane for mounting the package on a base. The cavity has a die mounting plane that is substantially non-parallel to the package mounting plane. The first leads are configured to provide electrical contacts within the cavity and to provide electrical contacts to the base.

11 Claims, 18 Drawing Sheets

(56) References Cited

U.S. PATENT DOCUMENTS

| | | |
|---|---|---|
| 6,035,712 A | 3/2000 | Ohta et al. |
| 6,060,780 A | 5/2000 | Ohta et al. |
| 7,851,829 B2 | 12/2010 | Theuss |
| 8,174,111 B2 * | 5/2012 | Xue et al. ............ 257/692 |
| 2004/0041254 A1 | 3/2004 | Long et al. |
| 2005/0136740 A1 | 6/2005 | Ludwig |

* cited by examiner

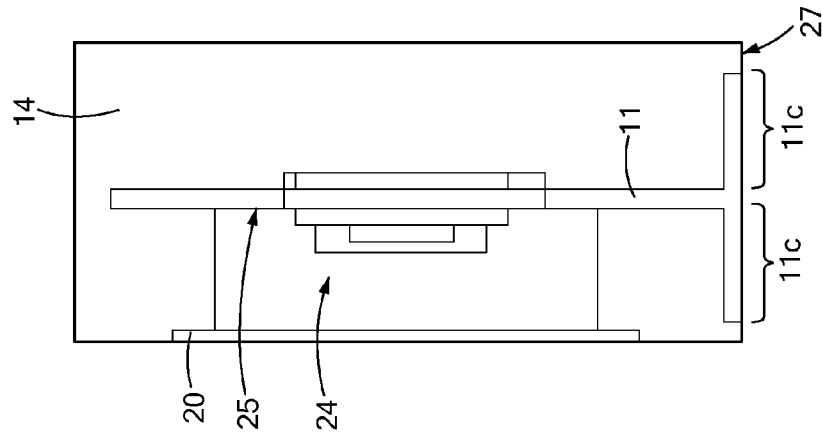
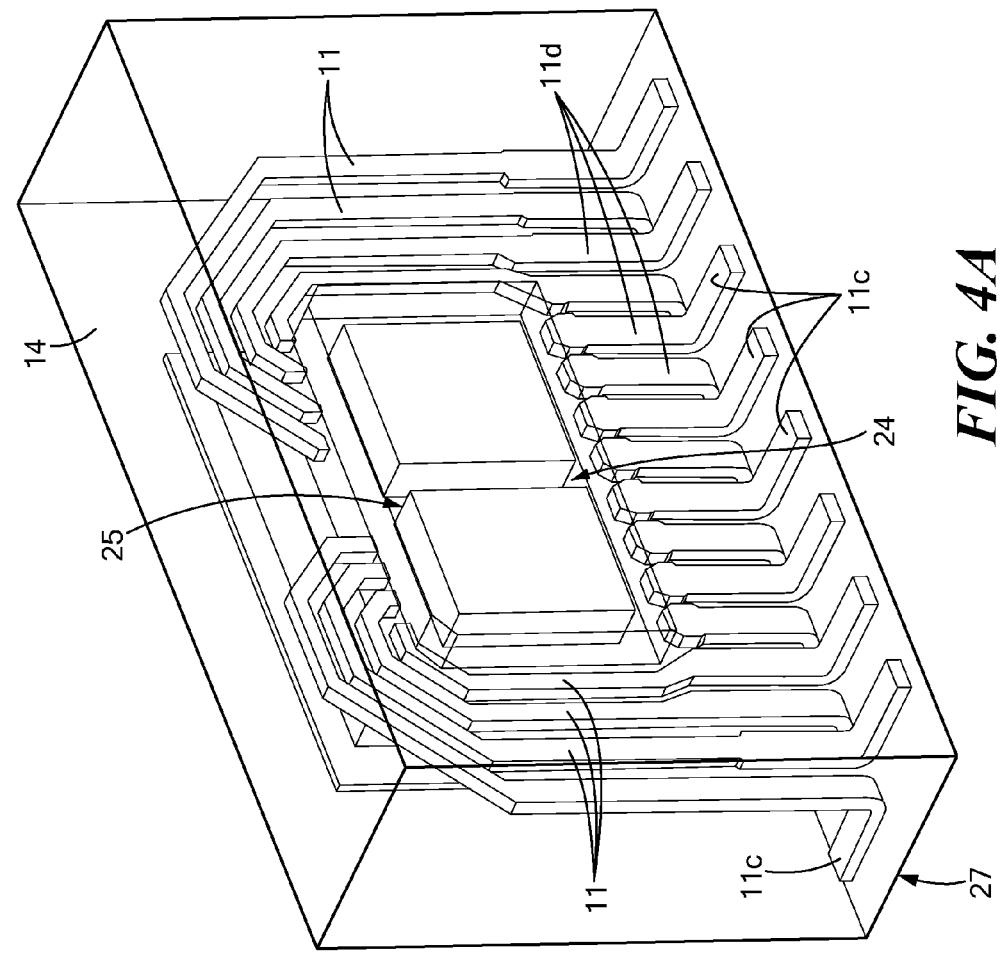
FIG. 4A
FIG. 4B

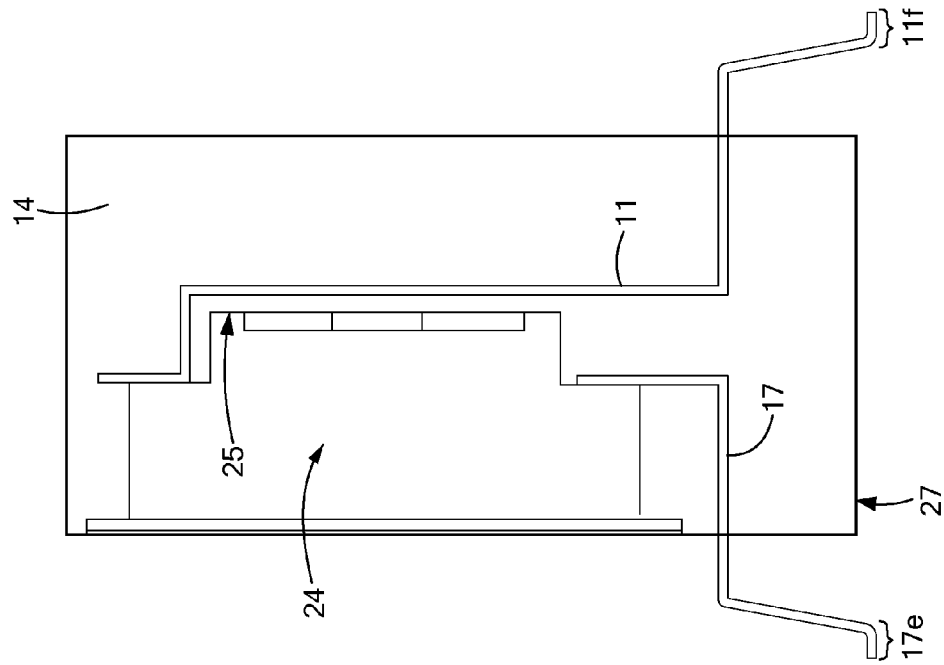
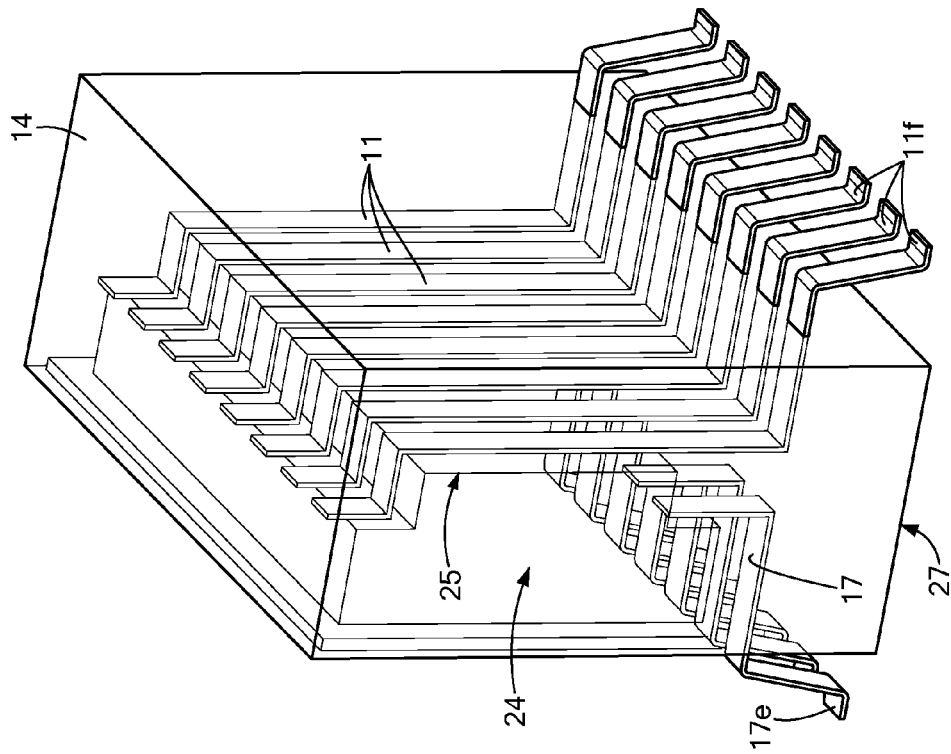

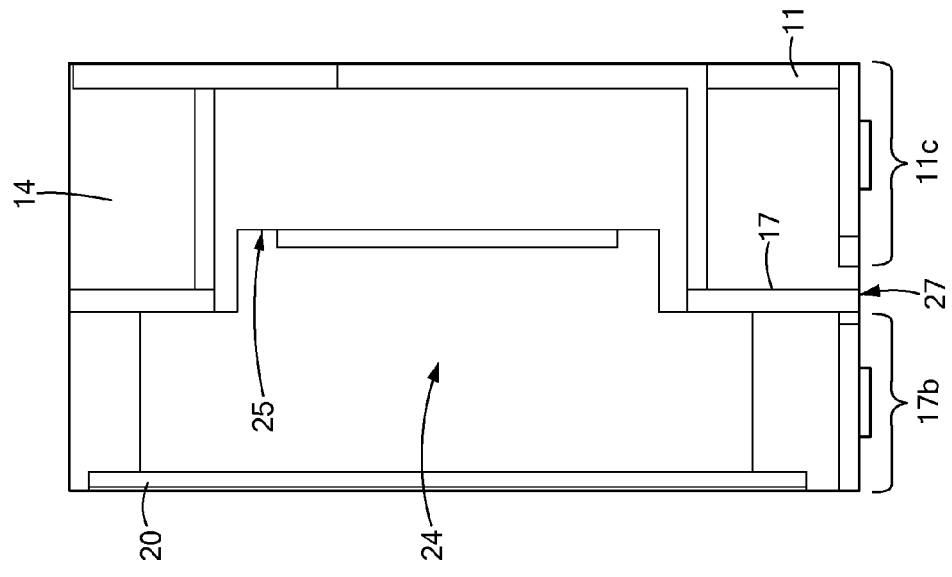
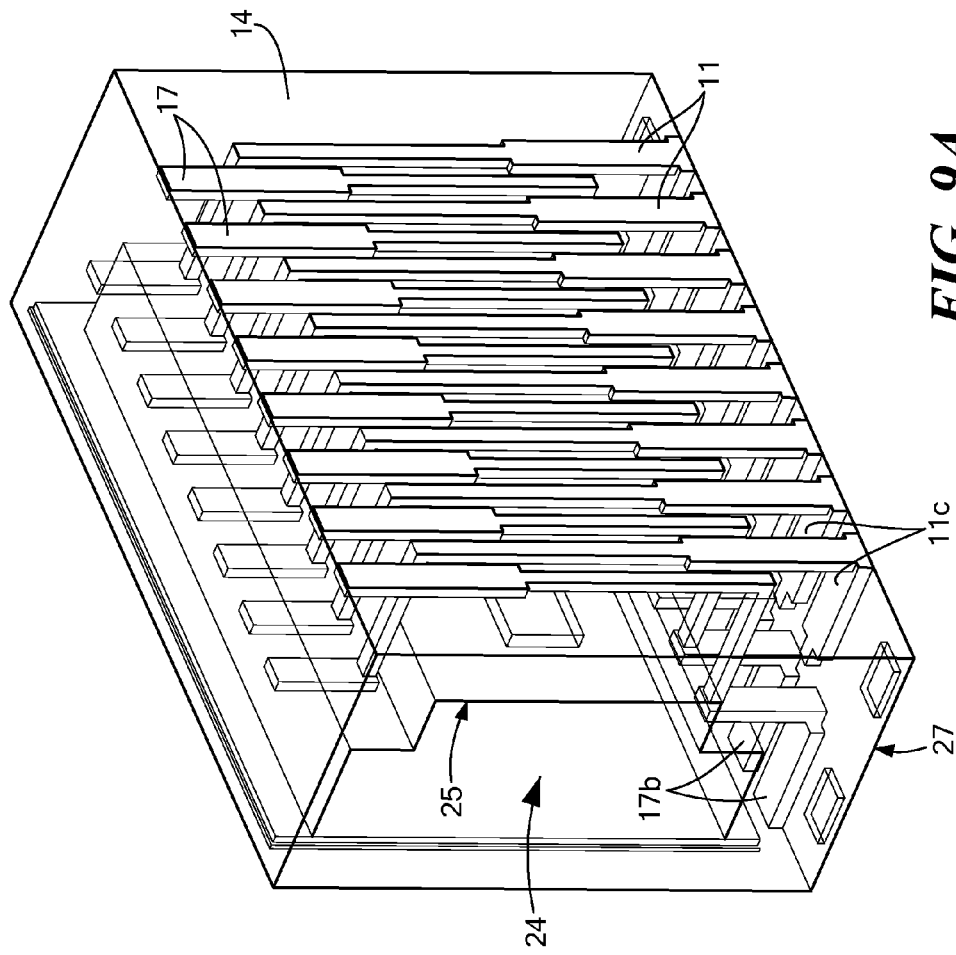

VERTICAL MOUNT PACKAGE FOR MEMS SENSORS

CROSS REFERENCE TO RELATED APPLICATIONS

The present application is a continuation of U.S. patent application Ser. No. 12/570,950, filed Sep. 30, 2009, which claims priority to U.S. Provisional Patent Application No. 61/101,437 filed Sep. 30, 2008, the disclosures of which are incorporated by reference herein in their entirety.

FIELD OF THE INVENTION

The invention generally relates to vertical mount package systems and, more particularly, the invention relates to vertical mount package systems for MEMS sensors.

BACKGROUND OF THE INVENTION

A variety of different applications use sensor systems to detect the movement of an underlying object. For example, inertial sensors, e.g., accelerometers or gyroscopes, are typically used in safety and navigation systems for automotive, military, aerospace and marine applications. Sensors employing microelectromechanical systems (MEMS) devices are increasingly used in such applications due to their relatively small size and their capability to detect relatively small amounts or changes in the measured item.

MEMS devices typically employ a movable mass formed with one or more fixed, non-moving structures. For example, the movable mass may be suspended in a plane above a substrate and movable with respect to the substrate. The movable structure and the fixed structures form a capacitor having a capacitance that changes when the movable structure moves relative to the fixed structures in response to applied forces or acceleration, such as along a predetermined axis of the device, e.g., x-, y- and z-axes.

MEMS devices are often mounted or secured within packages because of the moving structures involved and the typical required device sensitivities. These packages may protect the device and permit electrical connections from the device to other components or systems. One type of package currently used for some MEMS devices is a premolded leadframe package. These types of packages typically include a preformed or premolded housing having walls surrounding a leadframe at the base of the walls to form a cavity. The electrical connections are then usually provided through the walls of the housing, and the device is coupled to the leadframe at the bottom of the cavity.

In some applications, the sensor die is parallel to the package mounting plane so that the device is in a horizontal orientation. In other applications, the sensor die is perpendicular to the board or base that the package is mounted on, so that the device is held in a vertical orientation. In this situation, the package may need to be robust enough in order for the MEMS sensors to be functional or to work properly. In some cases, however, the package may impart unacceptable levels of stress on the device or may impart unacceptable levels of vibration to the device making it unusable.

SUMMARY OF THE INVENTION

In accordance with one embodiment of the invention, a vertical mount package for use with a MEMS sensor includes a first leadframe having first leads and molding material substantially surrounding at least a portion of the first leads. The molding material forms a cavity for holding the MEMS sensor and forms a package mounting plane for mounting the package on a base. The cavity has a die mounting plane that is substantially non-parallel to the package mounting plane. The first leads are configured to provide electrical contacts within the cavity and to provide electrical contacts to the base.

In accordance with another embodiment of the invention, a method of forming a vertical mount package for use with MEMS sensors provides a first leadframe having first leads and forms a moldable material around at least a portion of the first leads. The molding material forms a cavity for holding the MEMS sensor and forms a package mounting plane for mounting the package on a base. The cavity has a die mounting plane that is substantially non-parallel to the package mounting plane. The first leads are configured to provide electrical contacts within the cavity and to provide electrical contacts to the base.

In related embodiments, a second portion of the first leads may be substantially coplanar with the package mounting plane and the molding material may substantially surround the first leads. The molding material may form one or more extensions. A portion of the one or more extensions may form the package mounting plane. The one or more extensions may substantially surround a portion of the first leads or may not surround any of the first leads. A second portion of the first leads may protrude from the molding material and may be substantially parallel to the package mounting plane. The package may further include a second leadframe having second leads. The second leads may be configured to provide electrical contacts within the cavity and to provide electrical contacts to the base. At least a portion of the second leads may be disposed above at least a portion of the first leads. The first leads and the second leads may be configured to provide electrical contacts to the base on at least two sides of the vertical mount package. The die mounting plane may be substantially perpendicular to the package mounting plane. The package may further include two or more bumps coupled to the molding material and protruding from the package mounting plane.

In accordance with another embodiment of the invention, a vertical mount package assembly includes a MEMS sensor and a package surrounding the MEMS sensor. The package includes a first leadframe having first leads and molding material substantially surrounding at least a portion of the first leads. The molding material forms a cavity for holding the MEMS sensor and forms a package mounting plane for mounting the package on a base. The cavity has a die mounting plane that is substantially non-parallel to the package mounting plane. The first leads are configured to provide electrical contacts within the cavity to the MEMS sensor and to provide electrical contacts to the base. The assembly may further include an integrated circuit die electrically coupled to the MEMS sensor.

BRIEF DESCRIPTION OF THE DRAWINGS

The foregoing advantages of the invention will be appreciated more fully from the following further description thereof with reference to the accompanying drawings wherein:

FIG. 4A schematically shows a perspective view of a vertical mount package assembly formed with one leadframe according to illustrative embodiments of the present invention with the molding material shown as transparent;

FIG. 4B schematically shows a side view of the vertical mount package assembly of FIG. 4A with the molding material shown as transparent;

FIG. 8A schematically shows a perspective view of another vertical mount package assembly formed with two leadframes according to illustrative embodiments of the present invention with the molding material shown as transparent;

FIG. 8B schematically shows a side view of the vertical mount package assembly of FIG. 8A with the molding material shown as transparent;

FIG. 9A schematically shows a perspective view of another vertical mount package assembly formed with two leadframes according to illustrative embodiments of the present invention with the molding material shown as transparent;

FIG. 9B schematically shows a side view of the vertical mount package assembly of FIG. 9A with the molding material shown as transparent;

DESCRIPTION OF ILLUSTRATIVE EMBODIMENTS

Various embodiments of the present invention provide a vertical mount package and package assembly for use with MEMS sensors, such as MEMS inertial sensors, e.g., accelerometers and gyroscopes. The package may include one or two leadframes and molding material surrounding a portion of one or both leadframes. The molding material forms a cavity that the MEMS sensor may be positioned within. When two leadframes are used, one leadframe is positioned on top of or above the other leadframe. The leadframe(s) and molding material are formed so as to hold the MEMS sensor in a vertical orientation relative to a printed circuit board or other base that the package may be electrically connected to, although other non-parallel orientations may also be used. The molding material forms a package mounting plane that contacts the printed circuit board or base and permits the package to be mounted to the base. This configuration ensures that the package holds the MEMS sensor in the designated orientation relative to the base in a repeatable and reliable manner. The package, preferably, has a cavity large enough to hold multiple dies. The package configuration increases the package stability and minimizes the amount of stress imparted to the MEMS sensor, thus increasing the sensor reliability and performance. Reducing stress is particularly beneficial for applications entailing gyroscopes since those types of sensors are sensitive to stress. Details of illustrative embodiments are discussed below.

Figure 1:
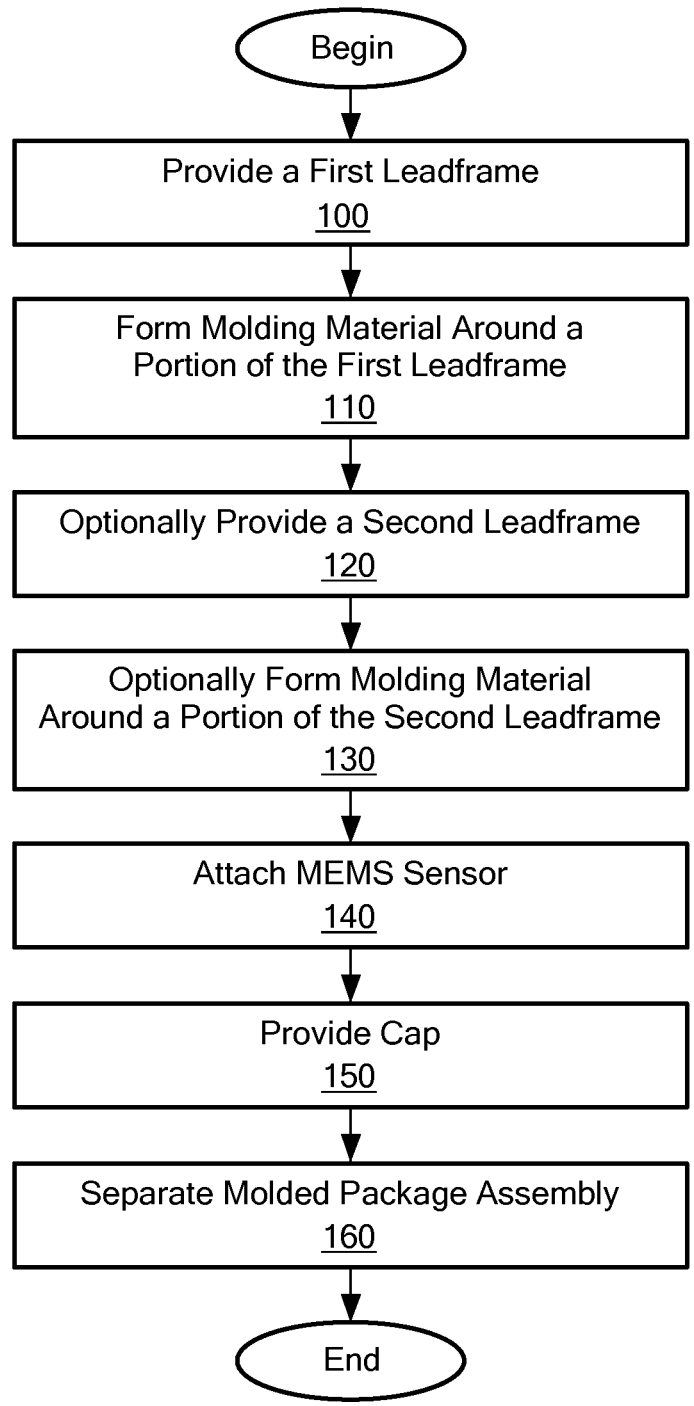
FIG. 1 shows a process of forming a vertical mount package and package assembly for use with MEMS sensors according to illustrative embodiments of the present invention.

FIG. 1 shows a process of forming a vertical mount package assembly and FIGS. 2A-2E schematically show perspective views during stages in the process of FIG. 1, according to illustrative embodiments of the present invention. Although the following discussion describes various relevant steps for forming the vertical mount package assembly, it does not describe all the required steps. Other processing steps may also be performed before, during, and/or after the discussed steps. Such steps, if performed, have been omitted for simplicity. The order of the processing steps may also be varied and/or combined. Accordingly, some steps are not described and shown. Similarly, although the following discussion involves inertial sensors, principles of illustrative embodiments may apply to other sensor devices, such as pressure sensors or microphones. Accordingly, discussion of inertial sensors is exemplary and is not intended to limit the scope of various embodiments of the invention.

Figure 2A:
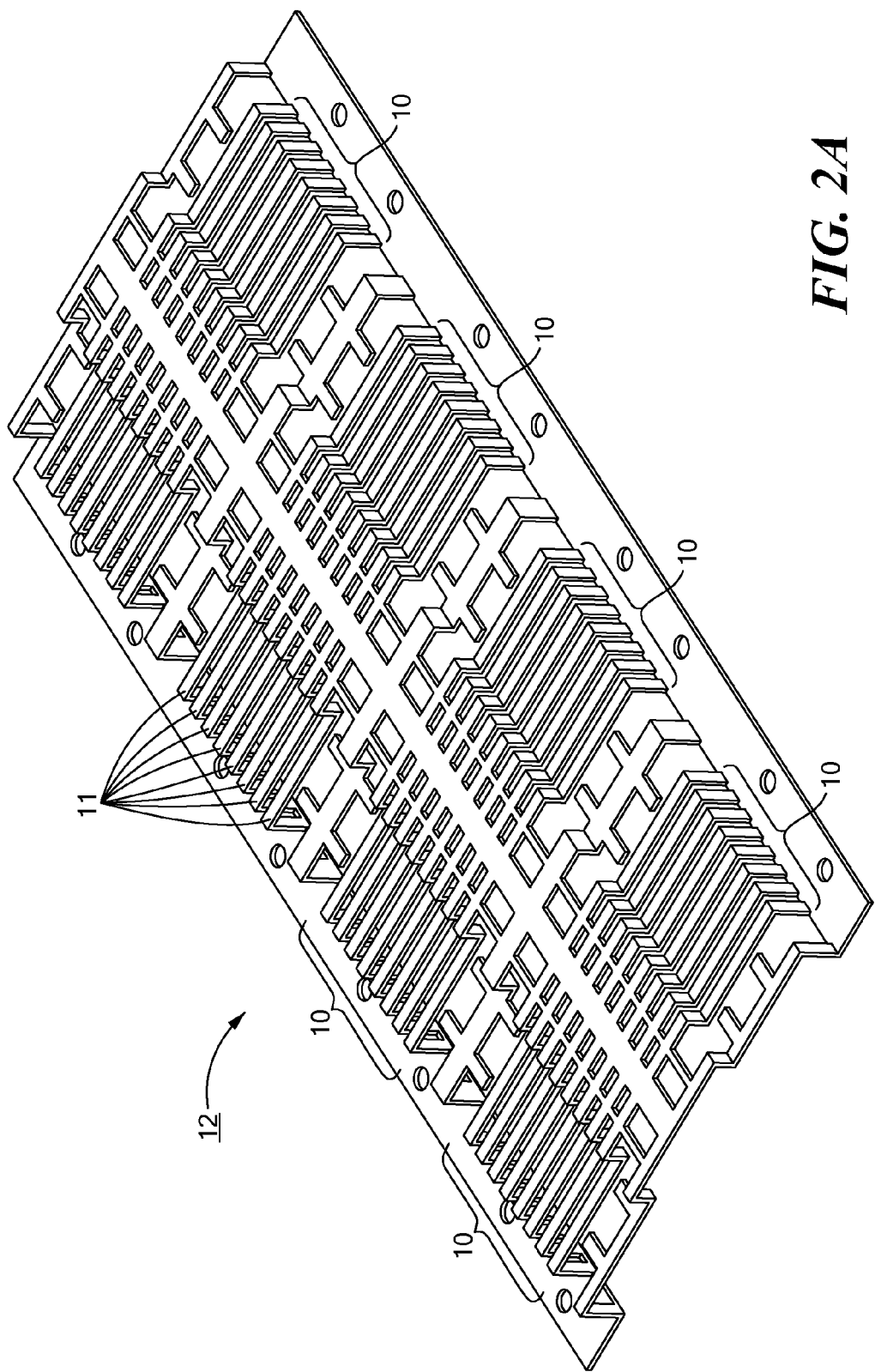
FIGS. 2A-2E schematically show perspective views during stages in the process of forming the vertical mount package assembly of FIG. 1 according to illustrative embodiments of the present invention.
Figure 2B:
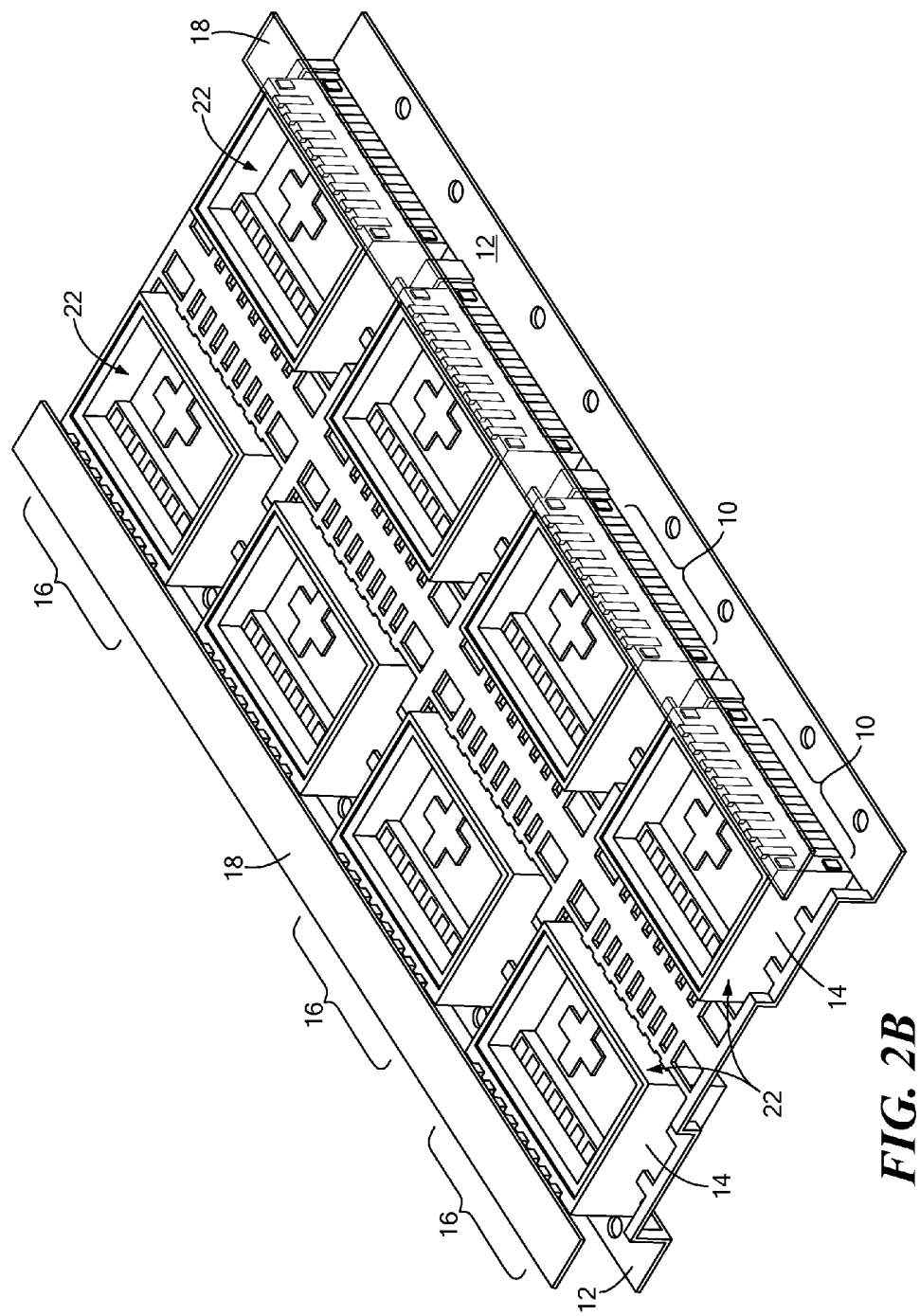

Referring to both FIGS. 1 and 2A, the process begins at step 100, which provides a first leadframe 10. The first leadframe 10 may be formed from a structural leadframe 12 having a plurality of first leadframes 10 joined together. The first leadframe 10 has a plurality of first leads 11. In step 110, molding material 14 may be formed around a portion of the first leads 11 in the first leadframe 10. As shown in FIG. 2B, the molding material 14 may be formed in one or more areas of the structural leadframe 12 around the plurality of first leadframes 10. The molding material 14 may be molded around the first leads 11 using known methods (e.g., transfer molding, injection molding) and using known materials, (e.g., thermoplastic or thermosetting materials, such as liquid crystal polymer (LCP) materials, polyphenylenesulphide (PPS) materials, polyphthalamide (PPA) materials, epoxy molding compound materials). In step 120, a second leadframe 16 may optionally be provided above a portion of the first leadframe 10 (from the perspective of FIG. 2B). The second leadframe 16 may be formed from a strip leadframe 18 having a plurality of second leadframes 16 joined together. The second leadframe 16 has a plurality of second leads 17 (not shown). As shown in FIG. 2B, two strip leadframes 18 may be provided above the structural leadframe 12. In step 130, molding material 14 may optionally be formed in one or more areas of the strip leadframe 18 around a portion of the second leads 17 in the second leadframe 16, thus forming a plurality of vertical mount packages 22. The molding material 14 may be molded around the second leads 17 using known methods (e.g., transfer molding, injection molding) and using known materials, (e.g., thermoplastic or thermosetting materials, such as LCP materials, PPS materials, PPA materials, epoxy molding compound materials).

Although the above discussion and drawings show providing the first leadframe 10 and then optionally providing the second leadframe 16, when two leadframes are used the order may be reversed in some embodiments. Similarly, in some embodiments, the molding material 14 may be formed around the second leadframe 16 and then formed around the first leadframe 16. Alternatively, both leadframes 10, 16 may be provided together and the molding material 14 may be formed around the first leadframe 10 and then formed around the second leadframe 16, or formed around the second leadframe 16 and then the first leadframe 10, or formed around both leadframes 10, 16 at substantially the same time or during the same processing step. Thus, the order of steps 100-130 may be varied and/or combined. When one leadframe 10 is used, the molding material 14 may form the plurality of vertical mount packages 22 without the need for a second leadframe and/or second molding material forming process.

Figure 2C:
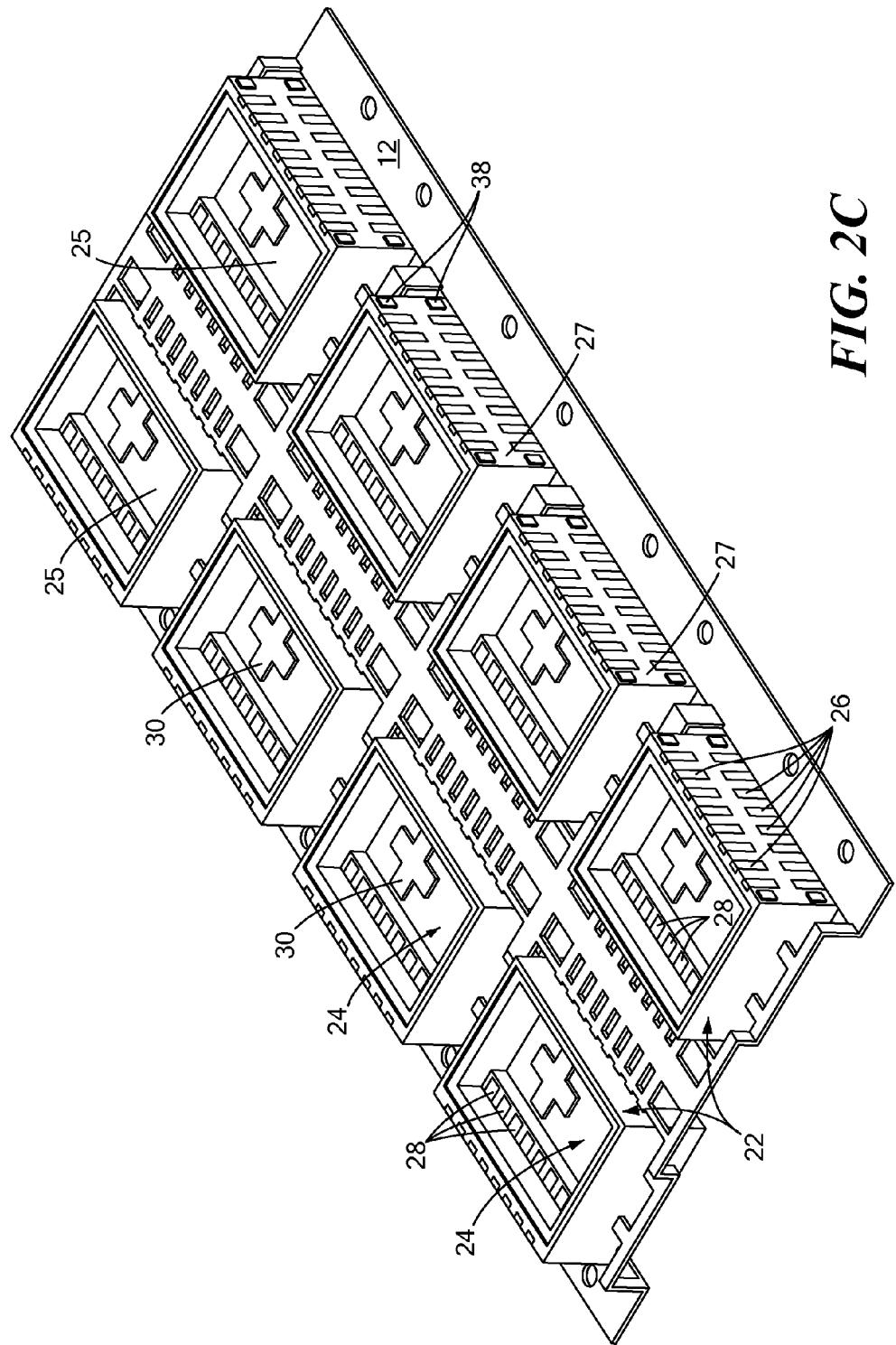

FIG. 2B shows eight vertical mount packages 22 being formed on one structural leadframe 12. However, any number of packages may be formed on the structural leadframe 12 and any number of packages may be formed at substantially the same time or a single package 22 may be formed. As shown in FIG. 2C, when two leadframes 10, 16 are used, a portion of the strip leadframe 18 may be removed from each package 22, although this may be done later in the process.

Figure 2D:
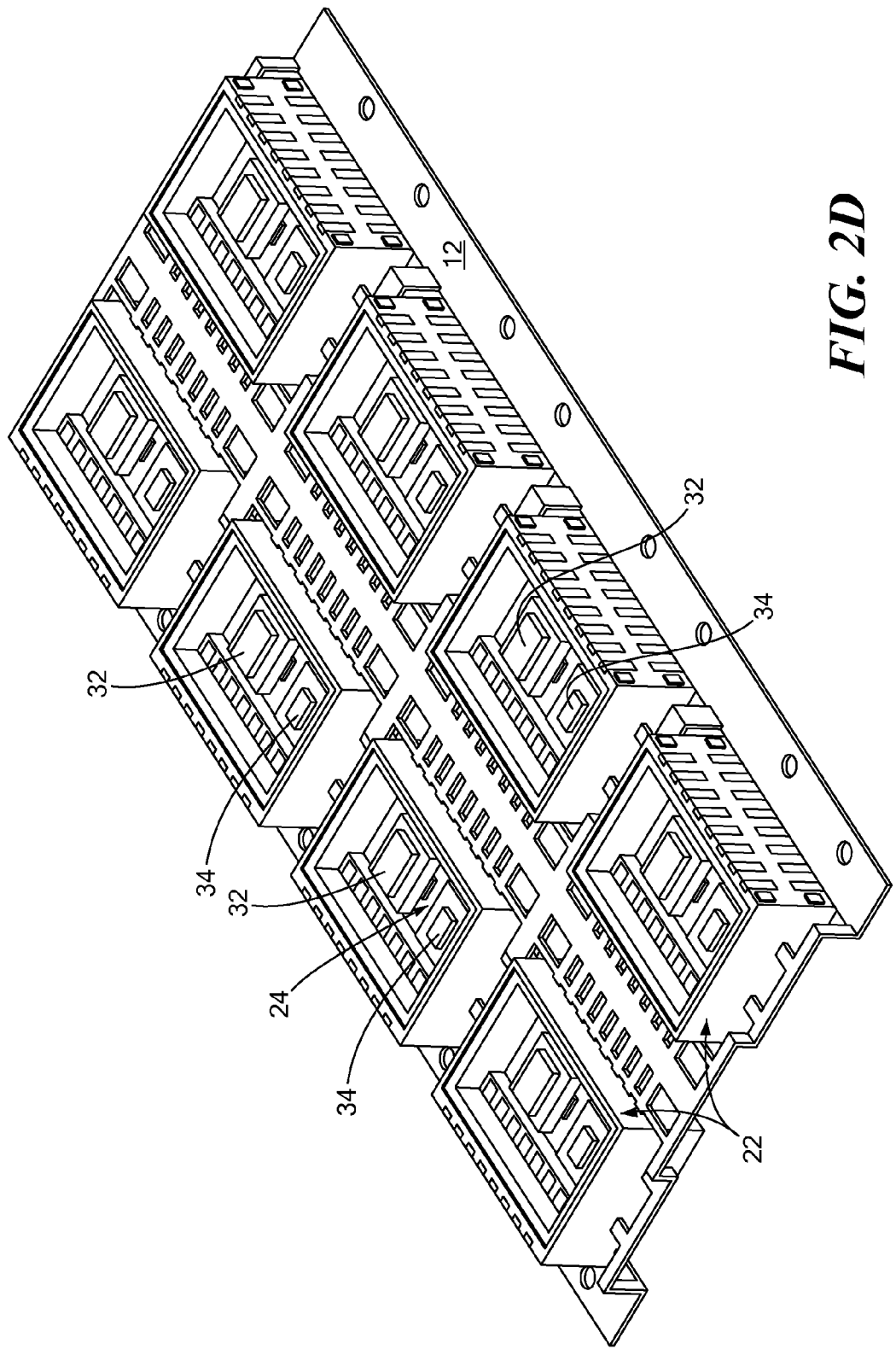

The molding material 14 forms a cavity 24 for holding a MEMS sensor (MEMS sensor shown in FIG. 2D). At the bottom of the cavity 24, the molding material 14 forms a die mounting plane 25 that may be used to mount one or more MEMS sensors, other dies, etc. The molding material 14 also forms a package mounting plane 27 for mounting the package 22 on the base. The die mounting plane 25 is substantially non-parallel to the package mounting plane 27, so that the MEMS sensor is held in a position other than a horizontal orientation relative to the base. For example, the package mounting plane 24 may be substantially perpendicular to the die mounting plane 25 so that the MEMS sensor is held in a vertical orientation relative to the base. Similarly, the package mounting plane 24 may be at a designated angle, other than zero, relative to the die mounting plane 25 so that the MEMS sensor is held at the designated angle relative to the base. Since the molding material is able to be formed within tight dimensional tolerances, this configuration ensures that the die mounting plane 25 and the package mounting plane 27 are positioned relative to one another in a repeatable and reliable manner for each package made. Consequently, this configuration enables the package 22 to hold the MEMS sensor in the designated orientation relative to the base in a repeatable way. Previously, vertical mount packages were coupled to and mounted on the base with leads that protruded from the molding material. In this case, the leads were bent or otherwise formed to form the package mounting plane, but the bending process resulted in a package that had a wider variation of the package mounting plane position to the die mounting plane. In addition, the unsupported leads may permit unacceptable levels of vibration in the package 22 that may compromise the performance of the MEMS sensors.

In embodiments of the present invention, the first leads 11 are configured to provide electrical contacts 28 within the cavity 24 and to provide electrical contacts 26 on the outside of the package 22. The molding material 14 is formed around a portion of the first leads 11 such that at least a surface of the first leads 11 remains uncovered so that an electrical connection may be made to the first leads 11 within the cavity 24 and on the outside of the package 22. When two leadframes 10, 16 are used, second leads 17 are also configured to provide electrical contacts 28 within the cavity 24 and to provide electrical contacts 26 on the outside of the package 22, and the molding material 14 is formed around a portion of the second leads 17 such that at least a surface of the second leads 17 remains uncovered so that an electrical connection may be made to the second leads 17 within the cavity 24 and on the outside of the package 22. As shown in FIG. 2C, a designated area 30 may be optionally formed in the molding material 14 for mounting the MEMS sensor 32. The area 30 elevates the MEMS sensor 32 from the die mounting plane 25 at the bottom of the cavity 24, thus reducing the stress imparted on the MEMS sensor 32. The area 30 is shown as a cross-shape in FIG. 2C, although other patterns may be used. For example, the area may be donut-shaped and adhesive may be provided in the inner circle area in order to further stabilize the mounting of the MEMS sensor 32. In addition, although one area 30 is shown, more than one area 30 may be optionally formed if more than one MEMS sensor is to be mounted or attached to the molding material 14.

In step 140, a MEMS sensor 32 is attached to the molding material 14 at the bottom of the cavity 24, as shown in FIG. 2D, to form a vertical mount package assembly 36. As known by those skilled in the art, any suitable attaching means may be used to attach the MEMS sensor 32 to the molding material 14, e.g., solder, an adhesive material, or a mechanical attachment. Although one MEMS sensor 32 is shown in each vertical mount package 22 in FIG. 2D, more than one sensor may be used in each package 22. The MEMS sensor 32 is electrically connected to the electrical contacts 28 by known methods, e.g., wire bonding, flip-chip, etc. One or more other dies 34 (e.g., an integrated circuit die) may be also attached to the bottom of the cavity 24. The die 34 may be electrically coupled to the electrical contacts 28 by known methods. The MEMS sensor 32 and the die 34 may be electrically connected to each other, or the MEMS sensor 32 may be formed on the same die with other circuitry, and the MEMS sensor 32, the die 34, or both may be electrically connected to the electrical contacts 28. One or more MEMS sensors 32 and dies 34 may be provided in each vertical mount package 22 in the same processing step. Similarly, the electrical connections from the MEMS sensors 32 and/or dies 34 to the electrical contacts 28 may be provided in each vertical mount package 22 in the same processing step.

Figure 2E:
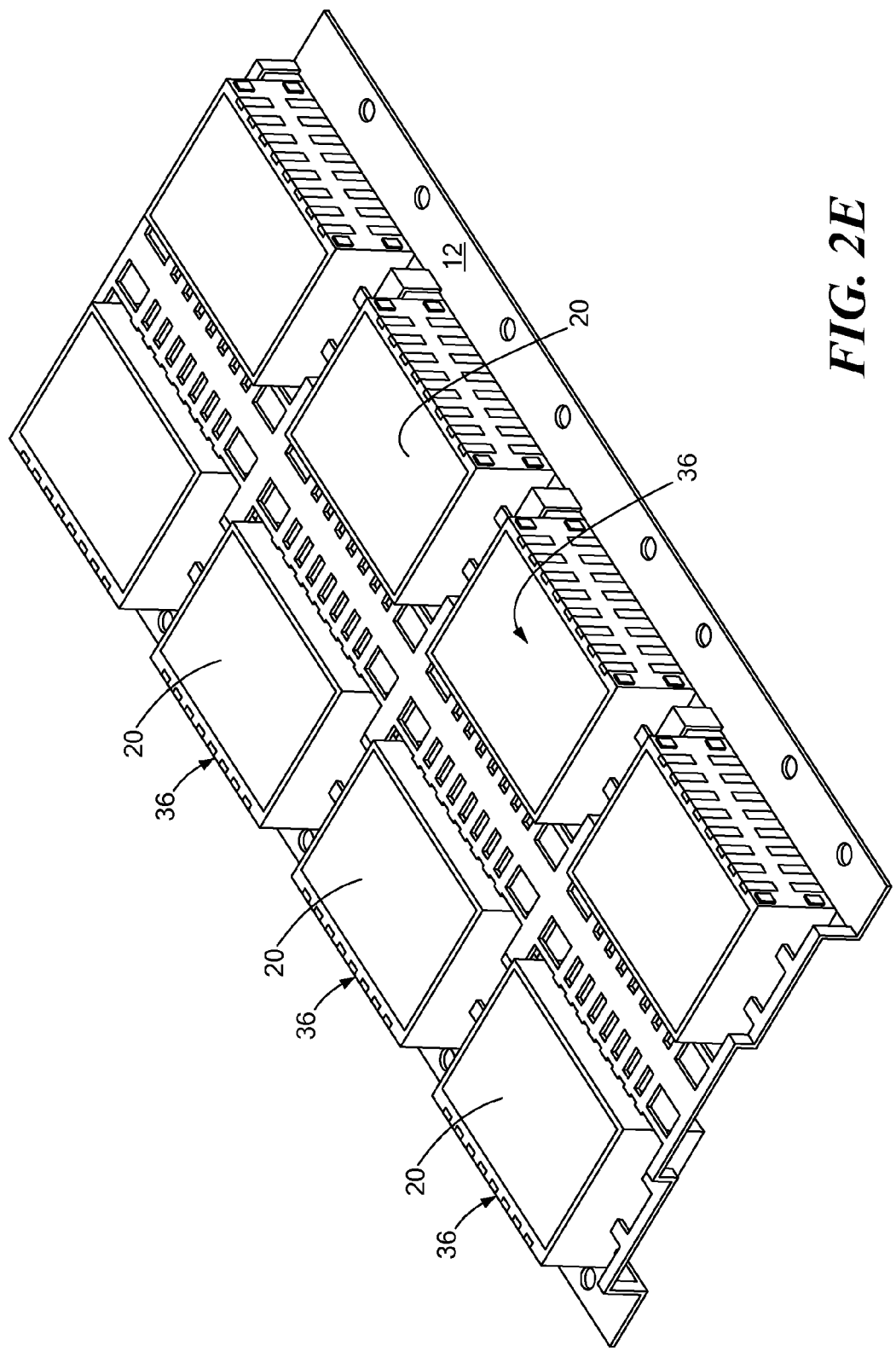

In step 150, a cap structure 20 may be added to the package assembly 36 to cover the cavity 24, as shown in FIG. 2E. To attach the cap structure 20 to the molding material 14, any suitable attaching methods may be used, e.g., solder, an adhesive material, or a mechanical attachment. The cap 20 may form a seal with the molding material 14 so as to protect the MEMS sensor 32 from hazards that may impact the functioning of the sensor, e.g., from gases, particles, moisture, etc. One or more caps 20 may be provided over the one or more assemblies 36 in the same processing step.

Other processing steps may be taken to complete production of the vertical mount package assembly 36. For example, in step 160, the vertical mount package assembly 36 may be separated from other package assemblies 36 formed in the structural leadframe 12 by known methods. As mentioned above, the vertical mount package assembly 36 shown and discussed in FIG. 1 and FIGS. 2A through 2E is exemplary. Thus, embodiments may vary from the process shown and discussed above. For example, the first leadframe 10 and/or the second leadframe 16 may have other configurations than shown. Similarly, the strip leadframe 18 may be removed from the vertical mount package assembly 36 at substantially the same time as the structural leadframe 12, rather than earlier in the process, or the strip leadframe 18 may be removed after the structural leadframe 12 is removed.

Figure 3B:
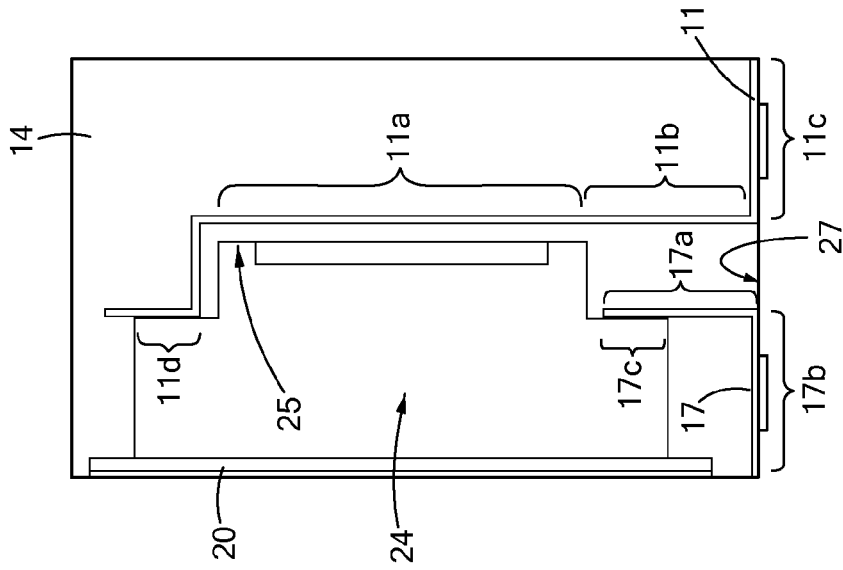
FIG. 3B schematically shows a side view of the vertical mount package assembly of FIG. 3A with the molding material shown as transparent.
Figure 3A:
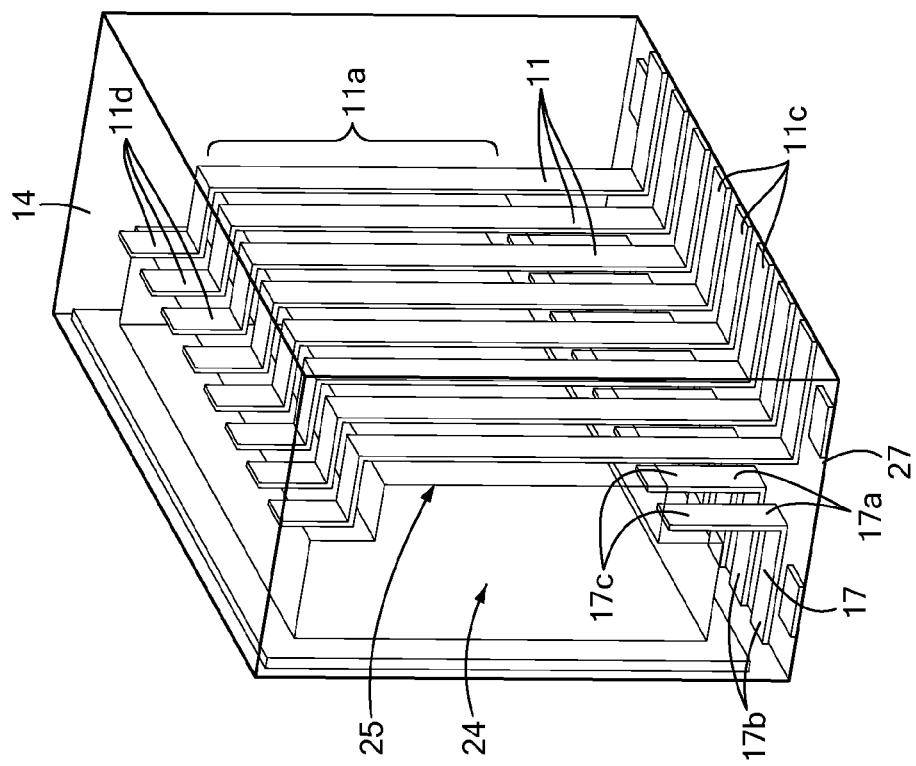
FIG. 3A schematically shows a perspective view of a vertical mount package assembly formed with two leadframes according to illustrative embodiments of the present invention with the molding material shown as transparent.

FIGS. 3A through 3D schematically show one embodiment of a vertical mount package assembly 36 formed with two leadframes. FIG. 3A schematically shows a perspective view of the assembly 36 with the molding material 14 transparent so as to show the configuration of the first and second leadframes 10, 16 within the assembly 36. FIG. 3B schematically shows a side view of the assembly 36 of FIG. 3A with the molding material 14 transparent. As shown in FIGS. 3A and 3B, the cavity 24 is facing toward the left. The first leadframe 10 has a number of first leads 11. The first leads 11 may have substantially the same configuration within the assembly 36, as shown, or may have a different configuration from one another within the assembly 36. Similarly, the second leadframe 16 has a number of second leads 17. The second leads 17 may have substantially the same configuration within the assembly 36, as shown, or may have a different configuration from one another within the assembly 36.

Referring also to FIG. 3B, the first leads 11 in the first leadframe 10 may have a portion 11a disposed beneath the cavity 24, although the first leads 11 may go around the cavity 24 without going beneath it. As used herein, above and below (or other such designations) are arbitrary, but refer to the directions previously used with respect to the assembly formation process discussed in FIG. 1 and FIGS. 2A through 2E. For example, the top of the assembly refers to the surface in which the cap may be formed. The second leads 17 in the second leadframe 16 have a portion 17a disposed above a portion 11b of the first leads 11.

The first leads 11 may have a portion 11c that is substantially coplanar with a portion 17b of the second leads 17. The first and second leads 11, 17 may be substantially surrounded by the molding material 14, but a surface of the first and second leads 11, 17 (the portions 11c and portions 17b) may not be surrounded or may be uncovered by the molding material 14 in order to provide the electrical contacts 26 for the outside of the vertical mount package 22, as better shown in FIGS. 3C and 3D. The uncovered surface of portions 11c and 17b are substantially coplanar with the package mounting plane 27.

Referring again to FIGS. 3A and 3B, the first leads 11 may have a portion 11d that is substantially coplanar with a portion 17c of the second leads 17. The first and second leads 11, 17 may be substantially surrounded by the molding material 14, but a surface of the first and second leads 11, 17 (portions 11d and 17c) may not be surrounded or may be uncovered by the molding material 14 in order to provide the electrical contacts 28 within the cavity 24 for the vertical mount package 22, as better shown in FIG. 3C.

Figure 3D:
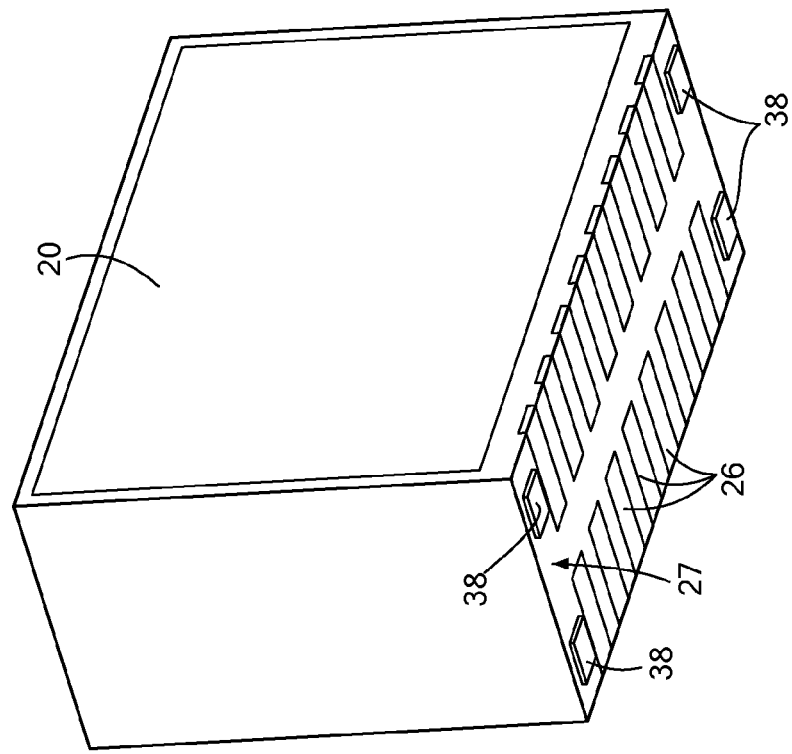
FIG. 3D schematically shows a perspective view of the vertical mount package assembly of FIG. 3A with a cap.
Figure 3C:
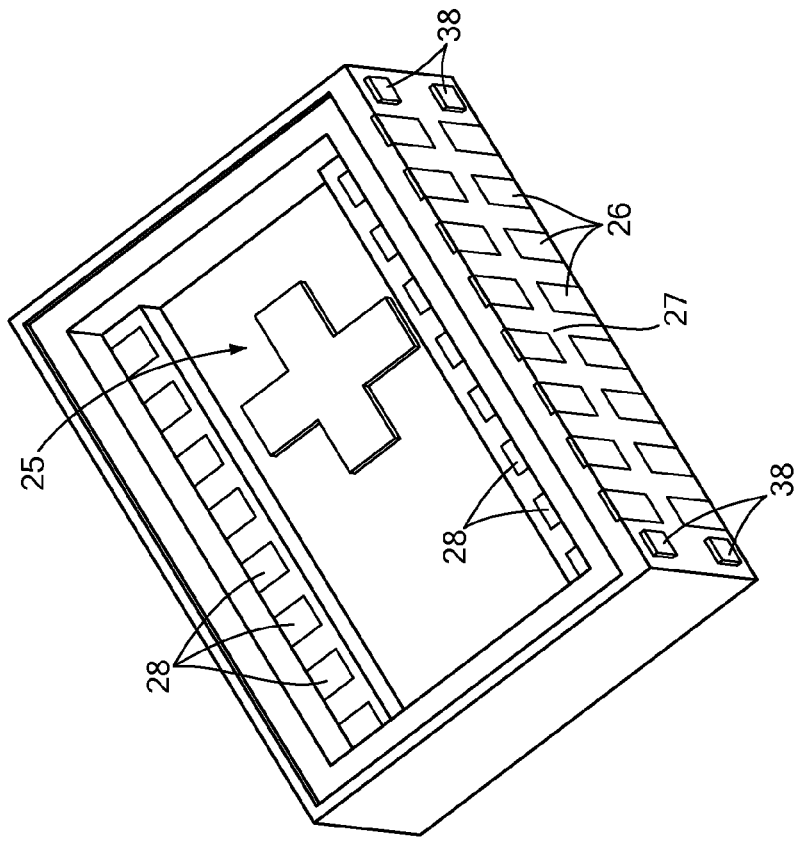
FIG. 3C schematically shows a perspective view of the vertical mount package assembly of FIG. 3A without a cap or a MEMS sensor.

The package mounting plane 27 may optionally include bumps 38 formed on the outside of the package 22 to stabilize it, as better shown in FIGS. 3C and 3D. One or more bumps 38 may be used, preferably two or more bumps, and the bumps 38 may be formed at the four corners, as shown, or anywhere on the molding material 14 on the mounting side of the package 22. The bumps 38 increase the standoff height of the package 22 and increase the solder joint reliability between the package 22 and a base (not shown) that the package 22 may be electrically connected to. When mounting the package 22 to the base, the package mounting plane 27 may be coupled to the base by known methods. For example, solder or some conductive material may couple the electrical contacts 26 to the base. The solder may be provided on the electrical contacts 26 with a minimum thickness of about the thickness of the bumps 38 so that the electrical contacts form an electrical connection with the base during a mounting process, e.g., a solder reflow process.

The first and second leads 11, 17 and molding material 14 are formed so as to hold the MEMS sensor 32 in a vertical orientation relative to the base. For example, the base may be any board, chip, material, etc. (e.g., a printed circuit board) that connects the vertical mount package assembly 36 to other components and/or systems. For example, the vertical mount package assembly 36 and/or one or more MEMS sensors 32 thereon may communicate with a central computer (not shown) through some interconnection medium. Although the package mounting plane 27 and the corresponding coplanar first and second leads 11, 17 are shown substantially perpendicular to the die mounting plane 25 in FIGS. 3A through 3D, the package mounting plane 27 and the corresponding first and second leads 11, 17 may be disposed at an angle other than ninety degrees from the die mounting plane 25.

Figure 4C:
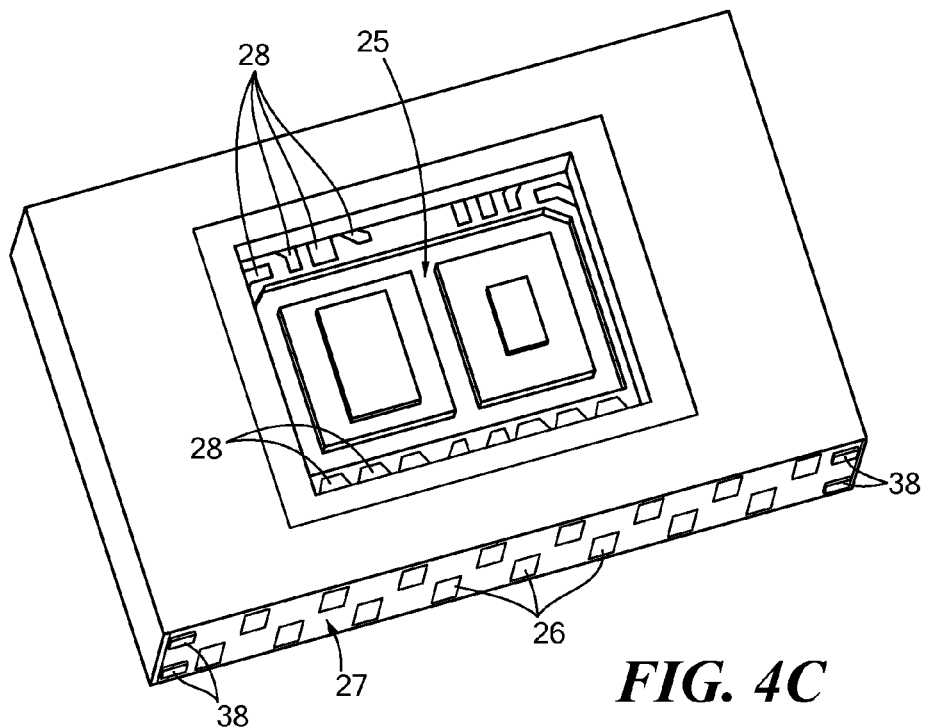
FIG. 4C schematically shows a perspective view of the vertical mount package assembly of FIG. 4A with a MEMS sensor and other die, but without a cap.

FIGS. 4A through 4D schematically show another embodiment of a vertical mount package assembly 36 formed with one leadframe. FIGS. 4A through 4D are similar to FIGS. 3A through 3D, respectively, except that the first leads 11 are disposed around the cavity 24 rather than beneath it. FIGS. 4A and 4B schematically show a perspective view and a side view, respectively, of the assembly 36 with the molding material 14 transparent so as to show the configuration of the first leadframe 10 within the assembly 36. As shown in FIG. 4B, the cavity 24 is facing toward the left. The first leadframe 10 has a number of first leads 11. In this embodiment, the first leads 11 have a different configuration from one another within the assembly 36.

Referring to FIG. 4A, the first leads 11 go around the cavity 24. The first leads 11 may have one or more portions 11c that are substantially coplanar with one another. The first leads 11 may be substantially surrounded by the molding material 14, but a surface of the first leads 11, the one or more portions 11c, may be uncovered by the molding material 14 in order to provide the electrical contacts 26 for the outside of the vertical mount package 22, as better shown in FIGS. 4C and 4D. The uncovered surface of portions 11c are substantially coplanar with or substantially parallel to the package mounting plane 27.

The first leads 11 may have one or more portions 11d that are substantially coplanar with one another. The first leads 11 may be substantially surrounded by the molding material 14, but a surface of the portions 11d of the first leads 11, may be uncovered by the molding material 14 in order to provide the electrical contacts 28 within the cavity 24 for the vertical mount package 22, as better shown in FIG. 4C.

Figure 4D:
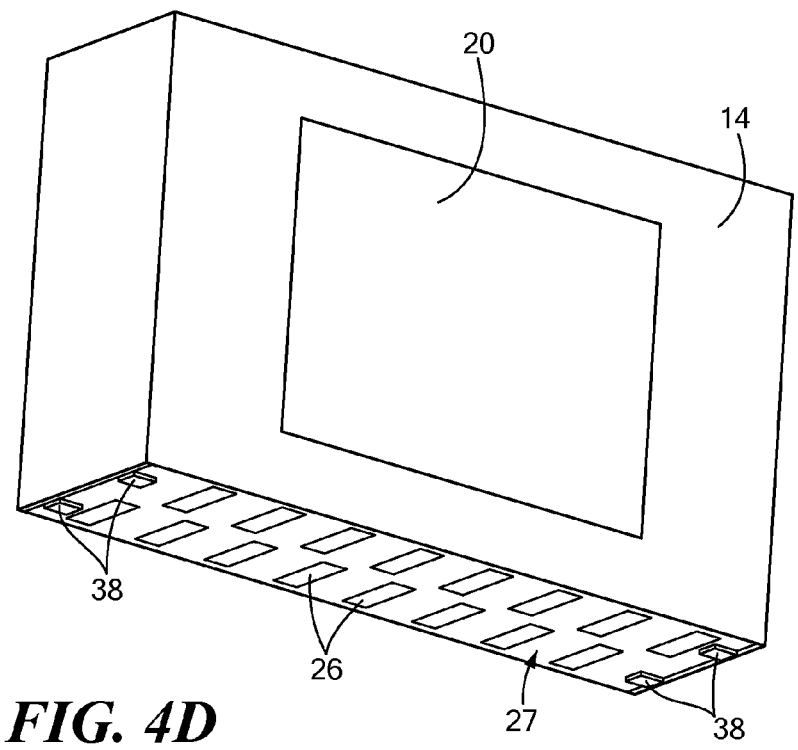
FIG. 4D schematically shows a perspective view of the vertical mount package assembly of FIG. 4A with a cap.

As previously discussed with respect to FIGS. 3C and 3D, the embodiment shown in FIGS. 4A through 4D may optionally include bumps 38 formed on the package mounting plane 27 on the outside of the package 22 to stabilize it, as better shown in FIGS. 4C and 4D.

Figure 5:
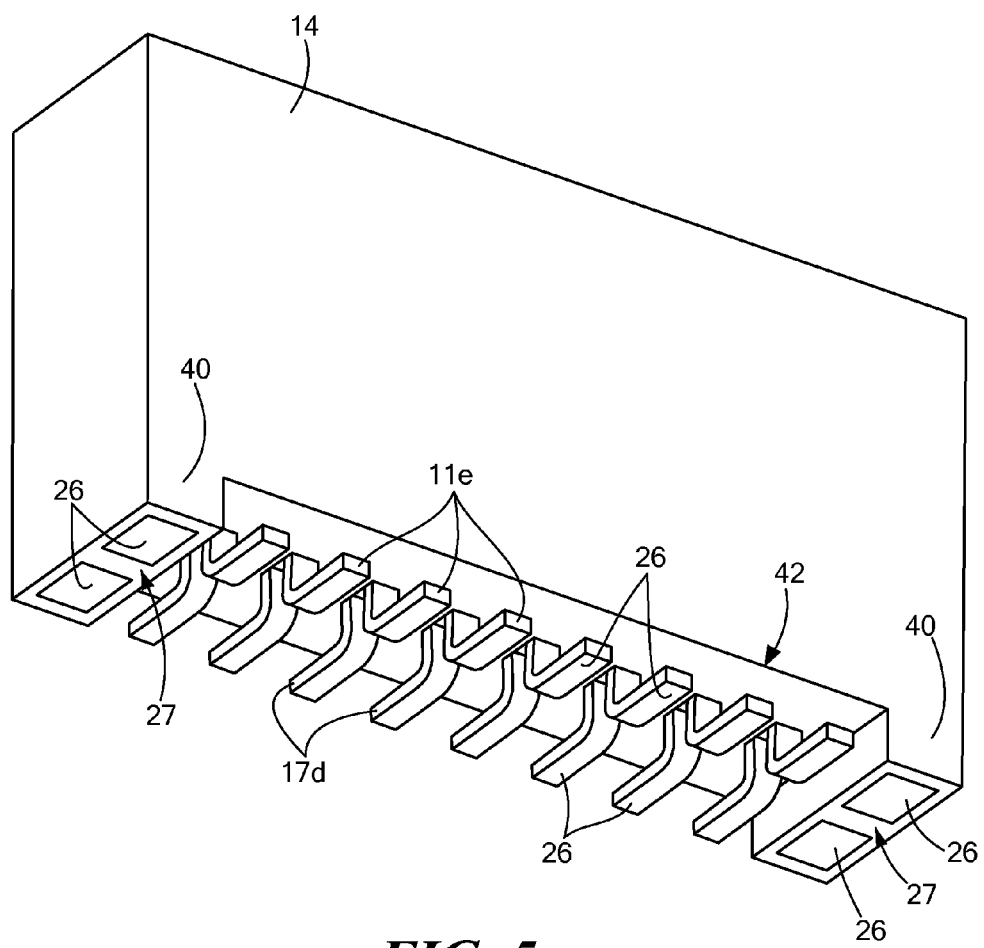
FIG. 5 schematically shows a perspective view of another vertical mount package assembly formed with two leadframes according to illustrative embodiments of the present invention.

FIG. 5 schematically shows another embodiment of a vertical mount package assembly formed with two leadframes, although one leadframe may also be used. FIG. 5 is similar to FIG. 3D, except that some of the first and second leads 11, 17 that form the electrical contacts 26 may be substantially surrounded by the molding material 14 and some of the first and second leads 11, 17 may protrude from the molding material 14. In this embodiment, the molding material 14 forms one or more extensions 40 that extend from a recessed molding plane 42. The bottom portion of the extension 40 forms the package mounting plane 27. The one or more extensions 40 may substantially surround the first leads 11 and substantially surround the second leads 17 when two leadframes are used, as shown in FIG. 5. Alternatively, the one or more extensions 40 may not surround any first leads 11 or any second leads 17 when two leadframes are used. When mounting the package 22 to the base, the one or more extensions 40 may be coupled to the base by known methods. For example, when the extensions include first leads 11 and/or second leads 17, solder or some conductive material may coupled the leads 11, 17 to the base. When the extensions 40 do not include any first leads 11 or second leads 17, the extensions 40 may be coupled to the base, e.g., using epoxy. Portions of the first leads 11 and/or the second leads 17 that protrude from the recessed molding plane 42 and that do not have any substantial molding material 14 surrounding it, have portions 11e, 17d that are substantially parallel to the package mounting plane 27. The surface of portions 11e and 17d may be substantially coplanar with the package mounting plane 27 or may be slightly recessed from the package mounting plane 27. For example, the surface of portions 11e, 17d may be recessed up to around 50 μm from the package mounting plane 27. The surface of portions 11e, 17d form the electrical contacts 26 for the package 22 and may be electrically coupled to the base by known methods, e.g., solder or some conductive material. This configuration provides increased solder joint reliability, since the exposed first and second leads 11, 17 that protrude from the recessed molding plane 42 are compliant, and also provides good vertical stability, since the one or more extensions 40, either with or without additional leads, are sturdy. The configuration also minimizes package tilt variations and reduces package vibration compared to prior art configurations that just have the leads mounting to and contacting the base. Although FIG. 5 shows the outer first and second leads 11, 17 on either end of the package 22 surrounded by the molding material 14 and the inner first and second leads 11, 17 exposed, any number of leads may be exposed and any number may be molded. In addition, any configuration of molded and exposed leads may be used. For example, the inner leads may be molded and the outer leads may be exposed, or there may be an alternating pattern of molded and exposed leads.

Figure 6:
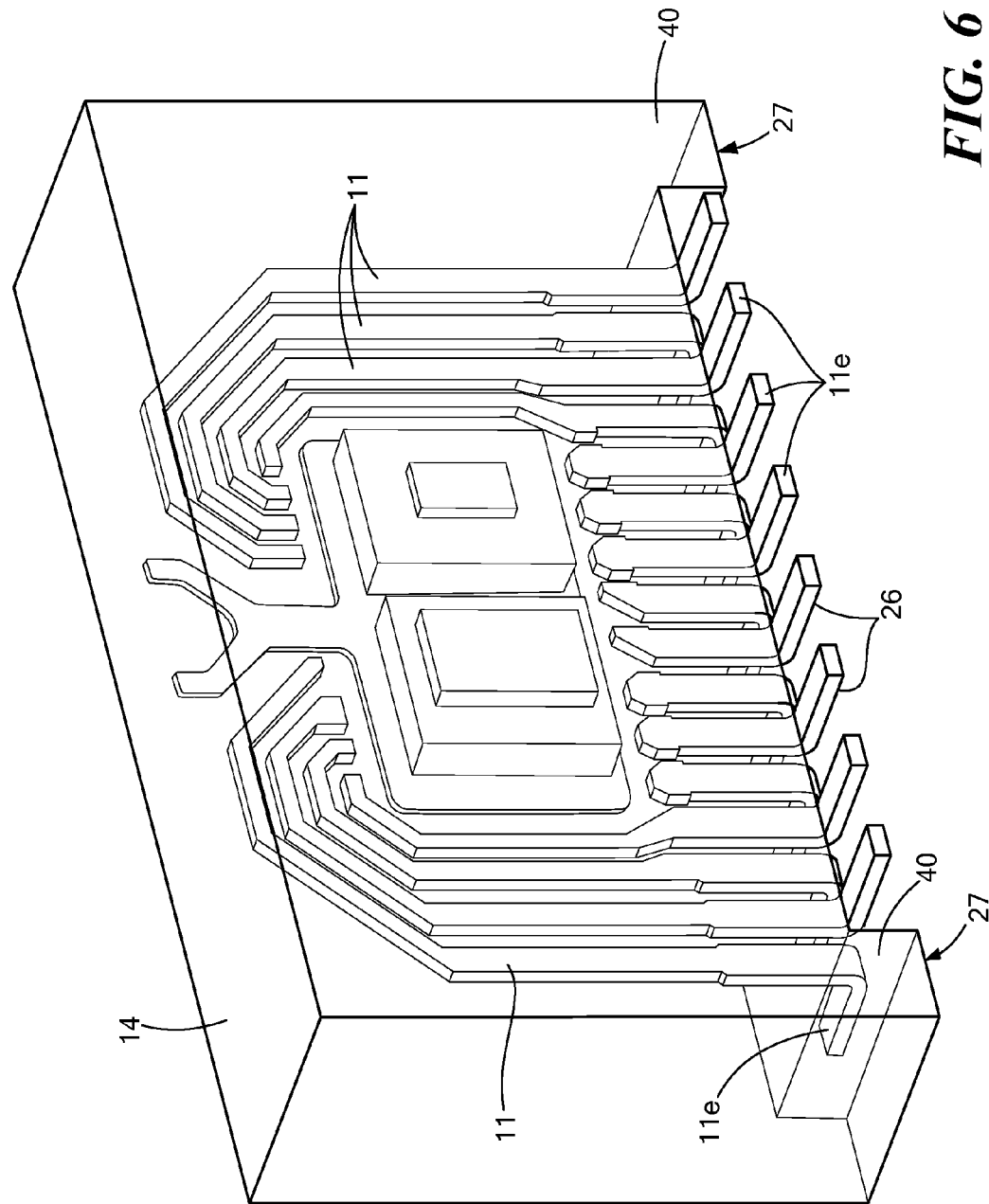
FIG. 6 schematically shows a perspective view of another vertical mount package assembly formed with one leadframe according to illustrative embodiments of the present invention with the molding material shown as transparent.

FIG. 6 schematically shows another embodiment of a vertical mount package assembly formed with one leadframe, although two leadframes may also be used. FIG. 6 is similar to FIG. 5, except that there are no leads in the one or more extensions 40. In addition, the first leads 11 are disposed around the cavity (not shown) rather than beneath it.

Figure 7:
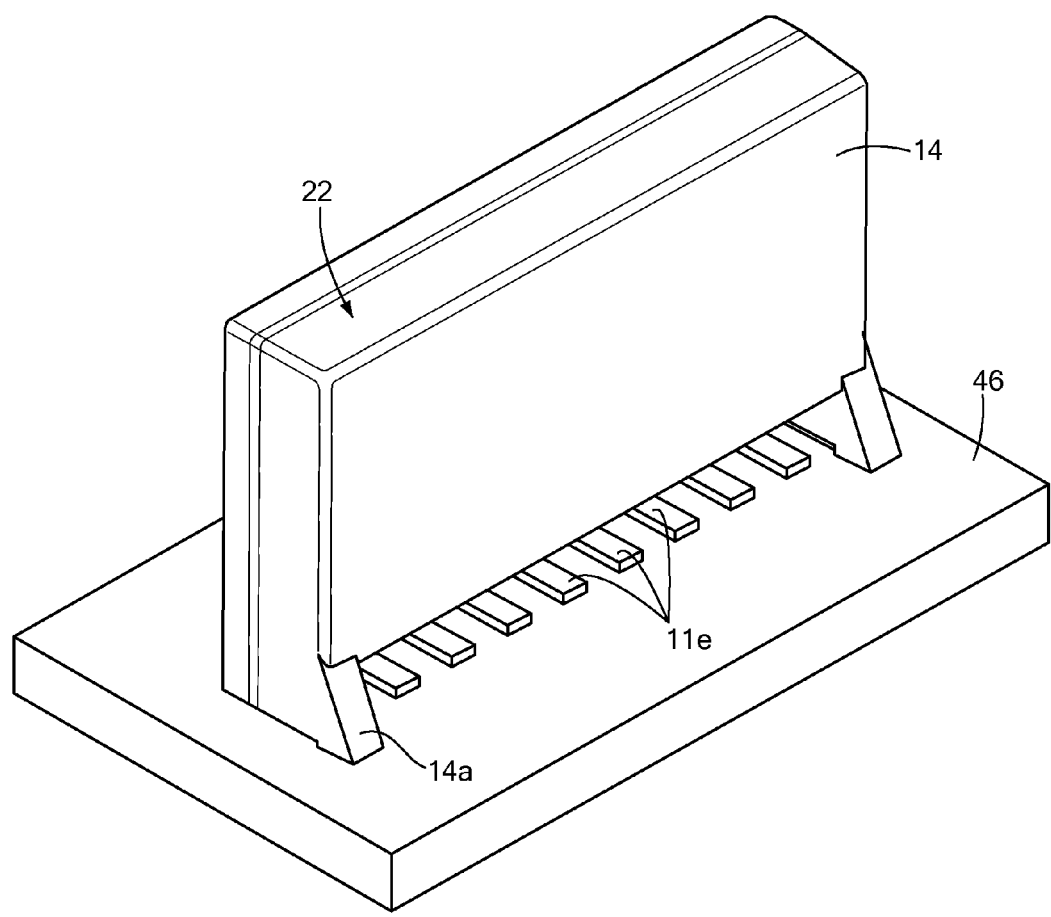
FIG. 7 schematically shows a perspective view of another vertical mount package assembly according to illustrative embodiments of the present invention.
Figure 8D:
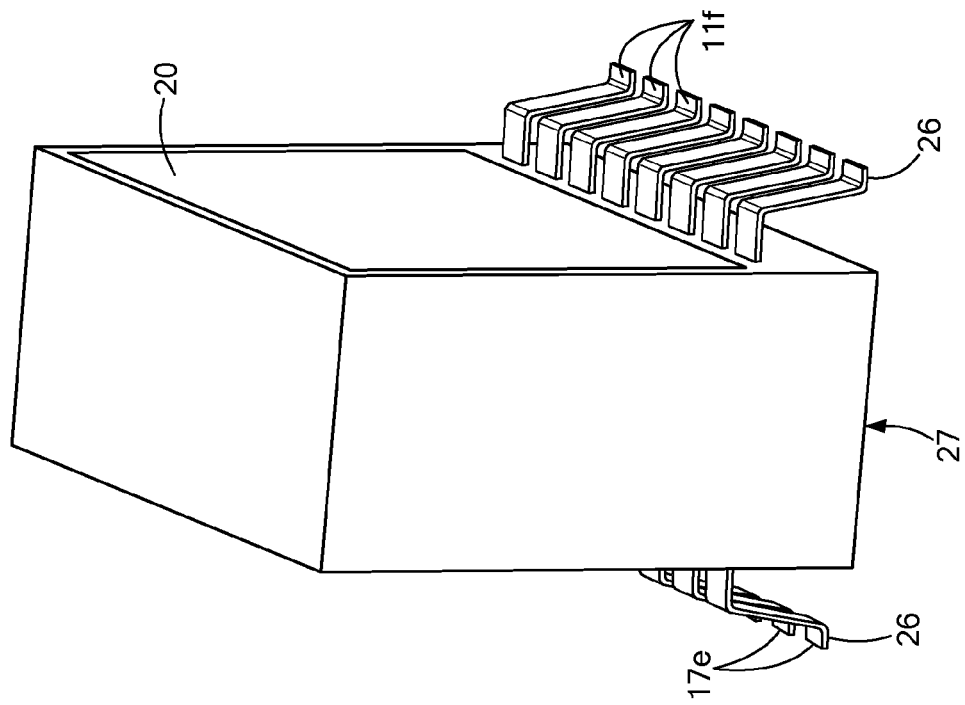
FIG. 8D schematically shows a perspective view of the vertical mount package assembly of FIG. 8A with a cap.
Figure 8C:
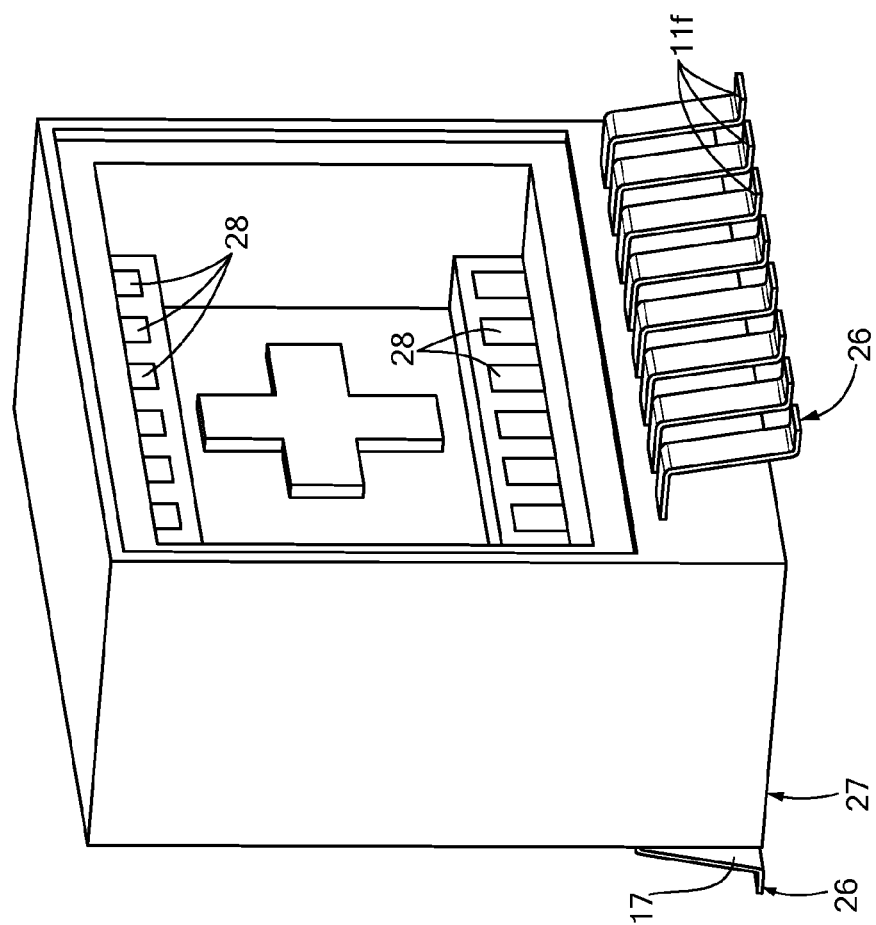
FIG. 8C schematically shows a perspective view of the vertical mount package assembly of FIG. 8A without a cap or a MEMS sensor.
Figure 9C:
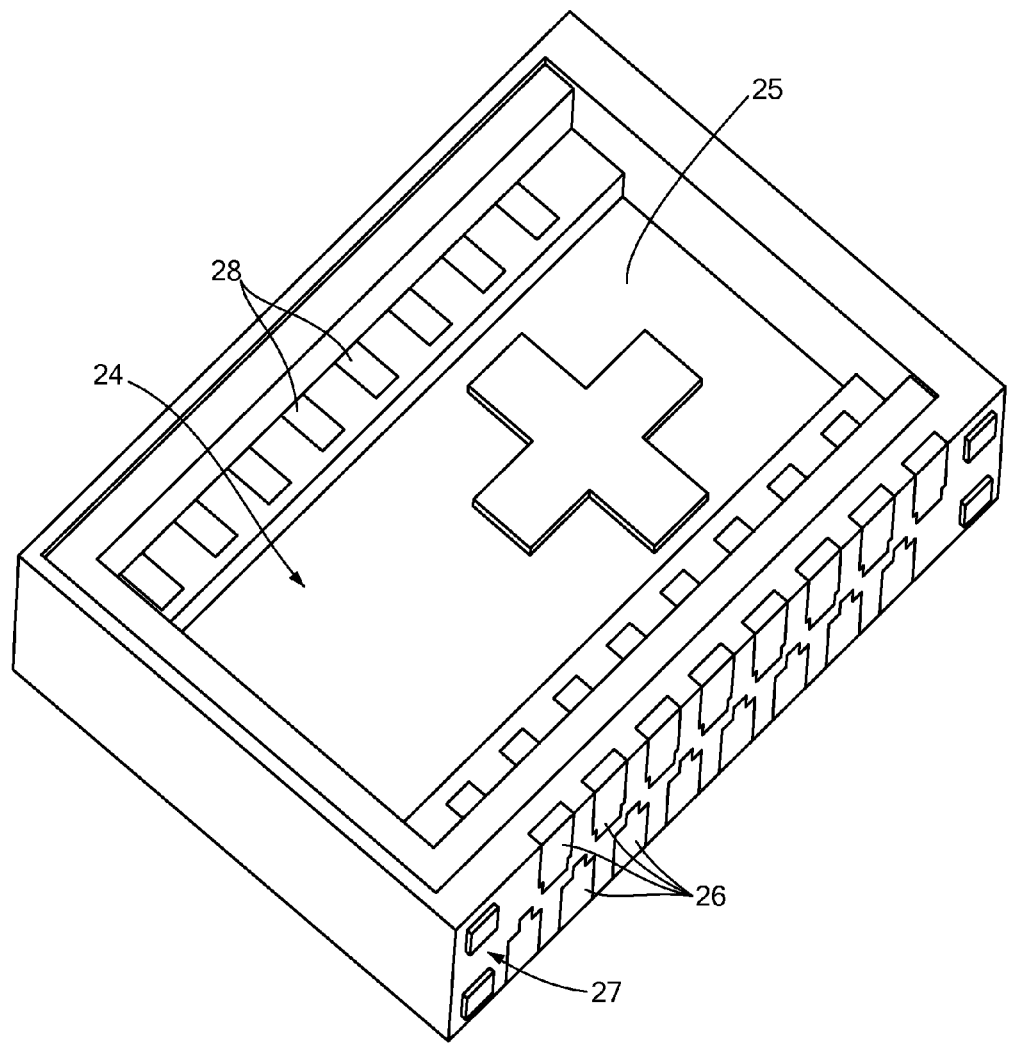
FIG. 9C schematically shows a perspective view of the vertical mount package assembly of FIG. 9A without a cap or a MEMS sensor.
Figure 9D:
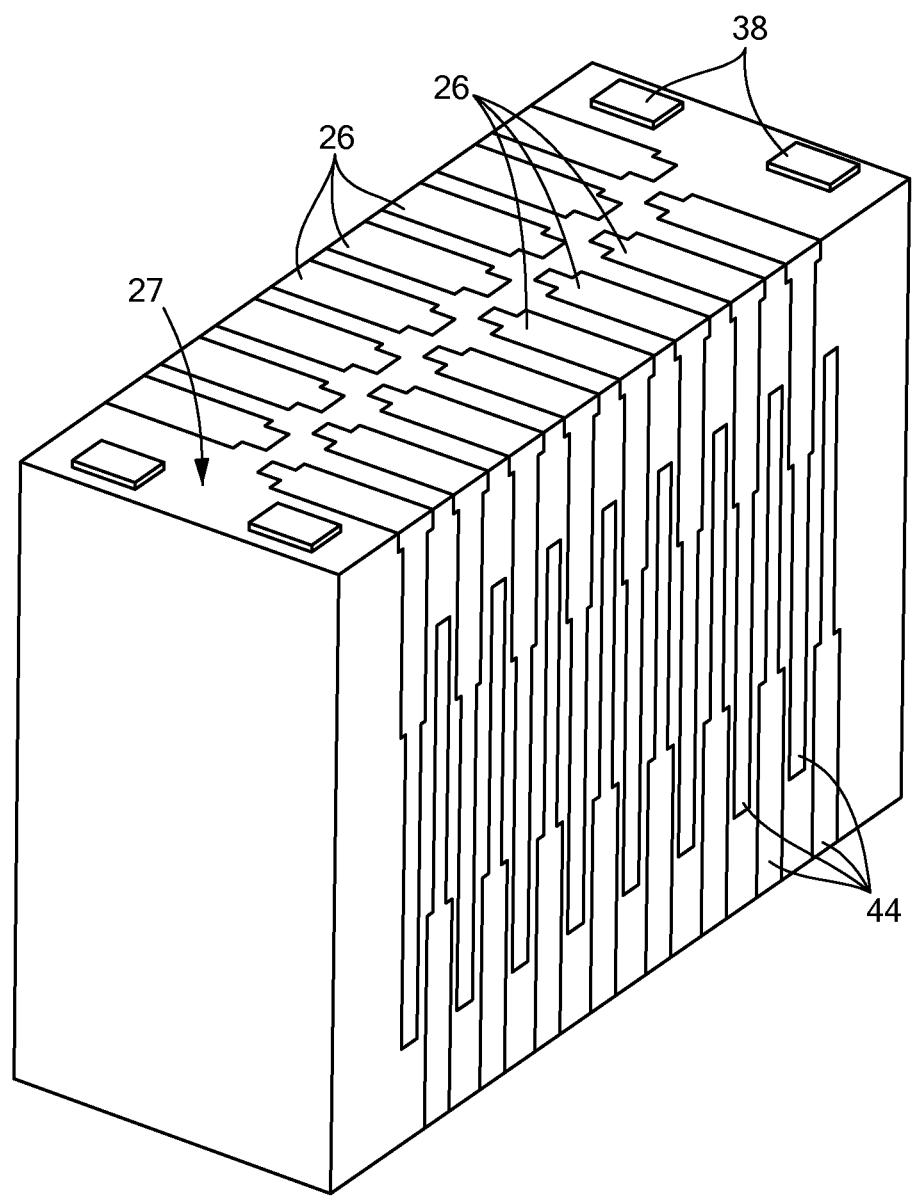
FIG. 9D schematically shows a perspective view of the vertical mount package assembly of FIG. 9A showing electrical contacts on two sides of the outside of the package.

In another embodiment, as shown in FIG. 7, the one or more extensions 40 may include additional molding material 14a. This configuration may provide for good stability of the package 22 with its connection to a base 46. The additional molding material 14a may be provided in any configuration around the exposed leads, e.g., having the contact surface of the package 22 form an I-shape, a T-shape, or an L-shape with the base 46.

FIGS. 8A through 8D schematically show another embodiment of a vertical mount package assembly 36. FIGS. 8A through 8D are similar to FIGS. 3A through 3D, respectively, except that portions of the first and second leads 11, 17 protrude out from the sides of the package 22 with one portion 11f of the first leads 11 and one portion 17e of the second leads 17 substantially coplanar or substantially parallel with the package mounting surface 27. This configuration may provide additional stability to the package 22 or assembly 36 and good solder joint reliability due to the compliance of the leads.

FIGS. 9A through 9D schematically show another embodiment of a vertical mount package assembly. FIGS. 9A through 9D are similar to FIGS. 3A through 3D, respectively, except the second leads 17 of the second leadframe 16 are further extended beneath the cavity 24. Thus, the first leads 11 and the second leads 17 are configured to provide electrical contacts to the base on at least two sides of the package 22. For example, electrical contacts 44 on the outside of the package 22 are disposed about ninety degrees from the electrical contacts 26, although other angles may be used if the package walls are disposed at other angles. This configuration allows the package 22 or assembly 36 to hold the MEMS sensor 32 in a vertical or horizontal orientation relative to the base. The configuration may also allow the package 22 or assembly 36 to hold the MEMS sensor 32 in any orientation relative to the base, e.g., any angle (instead of, or in addition to, horizontal or vertical).

Although the above discussion discloses various exemplary embodiments of the invention, it should be apparent that those skilled in the art can make various modifications that will achieve some of the advantages of the invention without departing from the true scope of the invention.

What is claimed is:

1. A vertical mount package for use with a MEMS sensor comprising:
  a first leadframe having first leads; and
  molding material substantially surrounding at least a portion of the first leads, the molding material forming a cavity for holding the MEMS sensor and forming a package mounting plane for mounting the package on a base, the cavity having a die mounting plane that is substantially non-parallel to the package mounting plane, the first leads configured to provide electrical contacts within the cavity and to provide electrical contacts to the base, at least one first lead disposed around one side of the cavity and at least another first lead disposed around an opposite side of the cavity.

2. The package of claim 1, wherein the molding material forms one or more extensions, at least a portion of the one or more extensions forms the package mounting plane, a second portion of the first leads protrudes from the molding material and is substantially parallel to the package mounting plane, wherein the one or more extensions do not surround any of the first leads.

3. The package of claim 1, wherein the molding material forms one or more extensions, at least a portion of the one or more extensions forms the package mounting plane, wherein the one or more extensions substantially surrounds a portion of the first leads.

4. The package of claim 3, wherein a second portion of the first leads protrudes from the molding material and is substantially parallel to the package mounting plane.

5. The package of claim 1, wherein a second portion of the first leads is substantially coplanar with the package mounting plane and the molding material substantially surrounds the first leads.

6. The package of claim 1, further comprising:
  two or more bumps coupled to the molding material and protruding from the package mounting plane.

7. The package of claim 1, further comprising:
  a second leadframe having second leads, the second leads configured to provide electrical contacts within the cavity and to provide electrical contacts to the base, at least a portion of the second leads disposed around one side of the cavity.

8. The package of claim 7, wherein the first leads and the second leads are configured to provide electrical contacts to the base on at least two sides of the vertical mount package.

9. The package of claim 1, wherein the die mounting plane is substantially perpendicular to the package mounting plane.

10. A vertical mount package assembly comprising:
a MEMS sensor; and
a package according to claim 1 surrounding the MEMS sensor.

11. The assembly of claim 10, further including an integrated circuit die electrically coupled to the MEMS sensor.

* * * * *